(12) United States Patent
Tihanyi

(10) Patent No.: US 6,326,656 B1
(45) Date of Patent: Dec. 4, 2001

(54) LATERAL HIGH-VOLTAGE TRANSISTOR

(75) Inventor: Jenoe Tihanyi, Kirchheim (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/511,813

(22) Filed: Feb. 24, 2000

Related U.S. Application Data

(63) Continuation of application No. PCT/DE99/00761, filed on Mar. 17, 1999.

(30) Foreign Application Priority Data

Jun. 24, 1998 (DE) .............................. 198 28 191

(51) Int. Cl.$^7$ .............................. H01L 29/72
(52) U.S. Cl. .................. 257/288; 257/339; 257/345; 257/355; 257/401; 257/402; 257/403; 257/404
(58) Field of Search .................. 257/288, 339, 257/345, 355, 401, 402, 403, 404

(56) References Cited

U.S. PATENT DOCUMENTS

| | | |
|---|---|---|
| 4,754,310 | 6/1988 | Coe . |
| 4,811,075 | 3/1989 | Eklund . |
| 5,111,254 | * 5/1992 | Levinson et al. ............ 257/288 |

FOREIGN PATENT DOCUMENTS

| | | |
|---|---|---|
| 43 09 764 A1 | 9/1924 | (DE) . |
| 41 07 909 A1 | 9/1991 | (DE) . |

OTHER PUBLICATIONS

Japanese Patent Abstract No. 62018768 (Sasaki), dated Jan. 27, 1987.

"A High Voltage Bulk Mesfet using In–Situ Junctions" (Levinson et al.), dated Apr. 8, 1991, IEEE Conference Record of the 1990 Ninteenth Power Modulator Symposium, pp. 347–351.

\* cited by examiner

Primary Examiner—Edward Wojciechowicz
(74) Attorney, Agent, or Firm—Herbert L. Lerner; Laurence A. Greenberg; Werner H. Stemer

(57) ABSTRACT

A lateral high-voltage transistor has a semiconductor body made of a lightly doped semiconductor substrate of a first conductivity type and an epitaxial layer of a second conductivity type. The epitaxial layer is provided on the semiconductor substrate. The lateral high-voltage transistor has a drain electrode, a source electrode, a gate electrode and a semiconductor zone of the first conductivity type which is provided under the gate electrode and is embedded in the epitaxial layer. Between the source electrode and the drain electrode trenches are provided in lines and rows in the semiconductor layer. The walls of the trenches are highly doped with dopants of the first conductivity type.

6 Claims, 2 Drawing Sheets

LATERAL HIGH-VOLTAGE TRANSISTOR

CROSS-REFERENCE TO RELATED APPLICATION

This application is a continuation of copending International Application No. PCT/DE99/00761, filed Mar. 17, 1999, which designated the United States.

BACKGROUND OF THE INVENTION

FIELD OF THE INVENTION

The invention relates to a lateral high-voltage transistor having a semiconductor body made of a lightly doped semiconductor substrate of a first conductivity type and an epitaxial layer of a second conductivity type provided on the semiconductor substrate. The transistor has a drain electrode a source electrode, a gate electrode and a semiconductor zone of the first conductivity type located under the gate electrode and embedded in the epitaxial layer.

Highly conductive lateral high-voltage transistors have already been proposed in a wide variety of configurations and are described for example in Published German Patent Application DE-A-43 09 764, U.S. Pat. No. 4,754,310, and U.S. Pat. No. 4,811,075. However, these conventional lateral high-voltage transistors are relatively difficult to fabricate, since the parallel n-conducting and p-conducting regions provided therein must have exactly the same area doping or sheet doping.

SUMMARY OF THE INVENTION

It is accordingly an object of the invention to provide a lateral high-voltage transistor which overcomes the above-mentioned disadvantages of the heretofore-known transistors of this general type and which is distinguished by a structure that is relatively simple to fabricate.

With the foregoing and other objects in view there is provided, in accordance with the invention, a lateral high-voltage transistor, including:

a semiconductor body including a semiconductor substrate and an epitaxial layer, the semiconductor substrate being of a first conductivity type and having a first dopant concentration, the epitaxial layer being provided on the semiconductor substrate and being of a second conductivity type, the second conductivity type being opposite the first conductivity type;

a drain terminal region and a source terminal region provided in the semiconductor body, and a gate terminal region;

a semiconductor zone of the first conductivity type provided under the gate terminal region and being embedded in the epitaxial layer; and the epitaxial layer having trenches formed therein, the trenches being defined by walls, the walls being of the first conductivity type and having a second dopant concentration higher than the first dopant concentration, the trenches being organized in lines and rows between the source terminal region and the drain terminal region.

In other words, in the case of a lateral high-voltage transistor of the type mentioned above, the object of the invention is achieved through the use of trenches in the epitaxial layer which are disposed in lines and rows between the source electrode and the drain electrode and whose walls are highly doped with a dopant of the first conductivity type. In this case, the trenches are interconnected in a line by line manner between the source electrode and the drain electrode on the surface of the epitaxial layer by lightly doped, strip-shaped regions of the first conductivity type.

Given a layer thickness of the epitaxial layer of, for example, approximately 20 µm, the trenches have a depth of approximately 18 µm and a diameter of approximately 1 µm.

The distance between rows of the trenches, that is to say between trenches in the direction between the source electrode and the drain electrode, is preferably dimensioned in such a way that the depletion of the region of the second conductivity type between the rows of trenches takes place before the trenches or their walls of the first conductivity type reach the breakdown voltage with respect to the epitaxial layer of the second conductivity type.

In the case of the lateral high-voltage transistor according to the invention, if a positive voltage is present at the drain electrode, while the source electrode is connected to ground, the depletion zone or space charge zone grows from the side of the source electrode in the direction of the side of the drain electrode as the voltage at the drain electrode rises. In this case, the floating trenches of the first conductivity type are, in a row by row manner, at the potential with which the depletion zone has reached the corresponding row of trenches. The depletion of charge carriers of the regions of the second conductivity type between the rows of trenches of the first conductivity type preferably takes place before the trenches of the first conductivity type reach the breakdown voltage with respect to the epitaxial layer of the second conductivity type.

Preferably, as already explained, the trenches are interconnected in lines on the surface of the semiconductor body by narrow regions of the first conductivity type, which are in the shape of strips and are lightly doped.

The trenches may form a structure which is formed to be annular or ellipsoidal in an elongate manner, the drain electrode essentially being disposed in the center of such a structure.

Other features which are considered as characteristic for the invention are set forth in the appended claims.

Although the invention is illustrated and described herein as embodied in a lateral high-voltage transistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
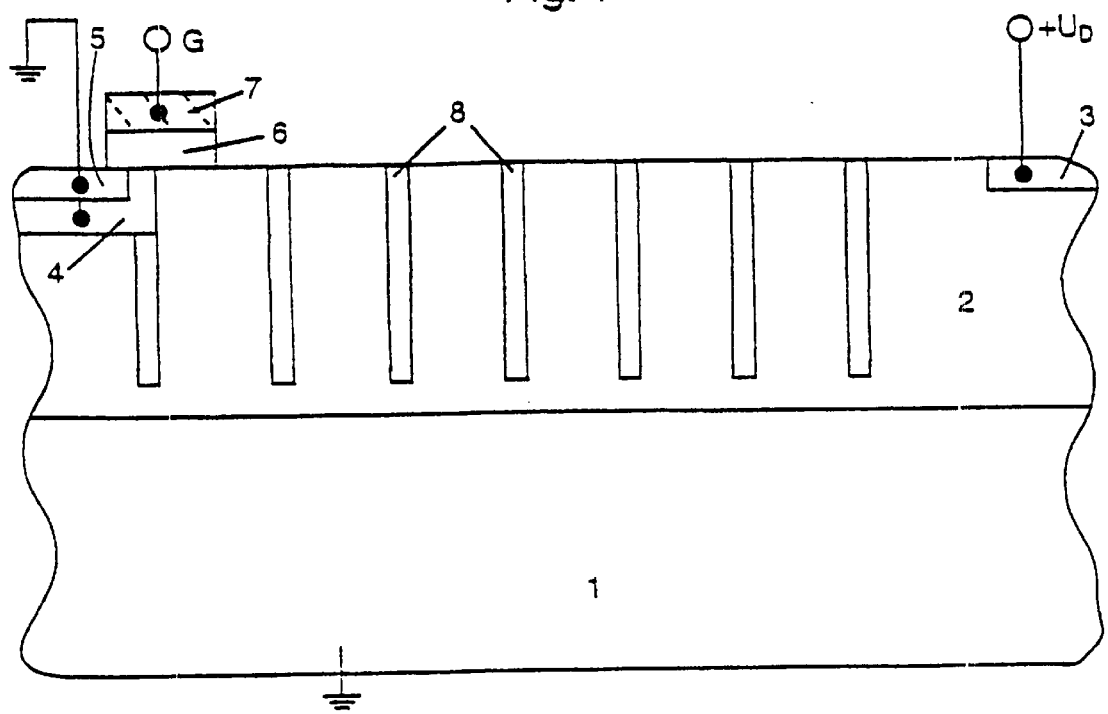
FIG. 1 is a partial, sectional view of the lateral high-voltage transistor according to the invention.

Referring now to the figures of the drawings in detail and first, particularly, to FIG. 1 thereof, there is shown an n-conducting epitaxial layer 2 provided on a p⁻-conducting silicon semiconductor substrate 1. An n⁺-conducting drain electrode terminal region 3, at which a voltage +$U_D$ is present, a p-conducting well 4 and an n⁺-conducting source electrode terminal region 5 are introduced into the surface of the epitaxial layer. The well 4 and the region 5 are connected to ground.

Above the p-conducting well, a gate electrode 7 with a contact G is provided on top of a gate insulating layer 6 made of silicon dioxide, for example.

Figure 2:
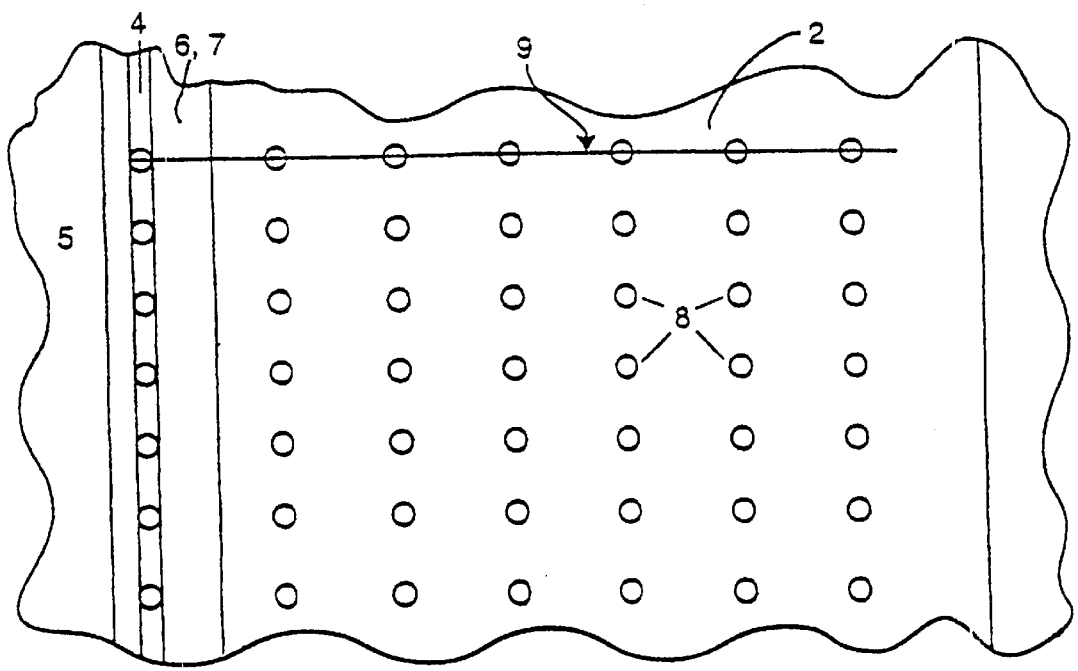
FIG. 2 is a partial plan view of the lateral high-voltage transistor of FIG. 1.
Figure 3:
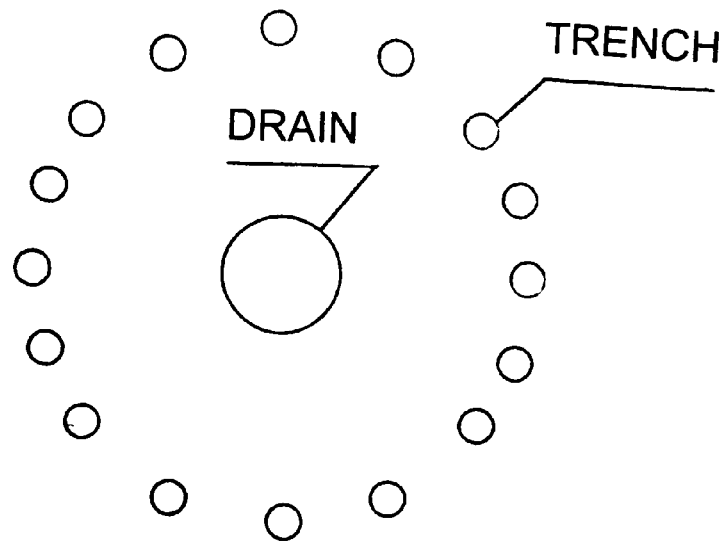
FIG. 3 is a diagrammatic, plan view of trenches forming a ring-shaped structure with the drain in the center.
Figure 4:
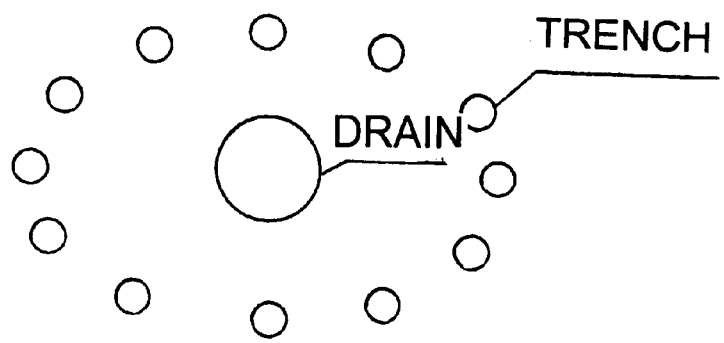
FIG. 4 is a diagrammatic, plan view of trenches forming an elongate, ellopsoidal structure with the drain in the center.

According to the invention, trenches 8 are situated between the terminal region 5 for the source electrode and the terminal region 3 for the drain electrode, the trenches being introduced, for example by etching, into the epitaxial layer 2 and their walls being highly doped with a p⁺-dopant, for example boron. This can be done by an out-diffusion from p-doped polycrystalline silicon or from a corresponding oxide filling. In this case, the trenches 8 are disposed in rows and lines, as is shown in FIG. 2. The trenches 8 are interconnected in lines on the surface with a narrow p⁻-conducting strip 9, as is indicated diagrammatically in the plan view of FIG. 2. The trenches 8 are "floating" or, in other words, not connected to a potential and, as has been explained, are interconnected in lines via the strips 9.

When a rising voltage +$U_D$ is applied to the terminal region 3, the space charge zone or depletion zone grows from the side of the source electrode (terminal region 5) in the direction of the side of the drain electrode (terminal region 3). In this case, the floating p⁺-conducting trenches 8 are, in rows, at the potential with which the space charge zone reaches the corresponding row. In other words, respective rows of trenches 8 are at an electrical potential that is present when the depletion zone reaches these respective rows of trenches.

The distance between the rows of trenches 8 that are illustrated in FIG. 1, is preferably dimensioned in such a way that the depletion of charge carriers of the epitaxial layer 2 between the rows takes place before the trenches 8 reach the breakdown voltage with respect to the n-conducting epitaxial layer 2.

The structure of the trenches 8 may be formed in a ring-shaped manner or in a stretched or elongate, ellipsoidal manner, wherein the drain (cf. the terminal region 3) is provided in the center of this structure.

I claim:

1. A lateral high-voltage transistor, comprising:
    a semiconductor body including a semiconductor substrate and an epitaxial layer, said semiconductor substrate being of a first conductivity type and having a first dopant concentration, said epitaxial layer being provided on said semiconductor substrate and being of a second conductivity type, said second conductivity type being opposite said first conductivity type;
    a MOSFET configuration including a drain terminal region and a source terminal region provided in said semiconductor body, and a gate terminal region;
    a semiconductor zone of said first conductivity type provided under said gate terminal region and being embedded in said epitaxial layer; and
    said epitaxial layer having trenches formed therein, said trenches having walls formed by said epitaxial layer, said walls being of said first conductivity type and having a second dopant concentration higher than said first dopant concentration, said trenches being organized in lines and rows between said source terminal region and said drain terminal region.

2. The lateral high-voltage transistor according to claim 1, wherein:
    said epitaxial layer has a surface;
    strip-shaped regions of said first conductivity type are disposed on said surface of said epitaxial layer, said strip-shaped regions have a third dopant concentration lower than said second dopant concentration; and
    each of said strip-shaped regions connects respective ones of said trenches along a respective one of said lines between said source terminal region and said drain terminal region.

3. The lateral high-voltage transistor according to claim 1, wherein said epitaxial layer has a layer thickness of approximately 20 $\mu$m, said trenches have a depth of approximately 18 $\mu$m and a diameter of approximately 1 $\mu$m.

4. The lateral high-voltage transistor according to claim 1, wherein:
    said trenches organized in said lines and said rows have a given distance between respective ones of said rows and have a breakdown voltage with respect to said epitaxial layer;
    said epitaxial layer of said second conductivity type has given regions provided between said rows; and
    said given distance being dimensioned such that said given regions reach a charge-carrier-depleted state before said trenches reach said breakdown voltage with respect to said epitaxial layer.

5. The lateral high-voltage transistor according to claim 1, wherein said trenches form a ring-shaped structure having a center, and said drain terminal region is disposed in said center of said ring-shaped structure.

6. The lateral high-voltage transistor according to claim 1, wherein said trenches form an elongate, ellipsoidal structure having a center, and said drain terminal region is disposed in said center of said elongate, ellipsoidal structure.

\* \* \* \* \*